United States Patent
Mumola

Patent Number: 6,074,947
Date of Patent: Jun. 13, 2000

[54] PROCESS FOR IMPROVING UNIFORM THICKNESS OF SEMICONDUCTOR SUBSTRATES USING PLASMA ASSISTED CHEMICAL ETCHING

[75] Inventor: Peter B. Mumola, Trumbull, Conn.

[73] Assignee: Plasma Sil, LLC, St. Peters, Mo.

[21] Appl. No.: 09/113,274

[22] Filed: Jul. 10, 1998

[51] Int. Cl.$^7$ .................................................. H01L 21/302
[52] U.S. Cl. .......................... 438/689; 438/704; 438/706
[58] Field of Search .................................... 438/689, 690, 438/691, 692, 695, 697, 704, 706; 156/345

[56] References Cited

U.S. PATENT DOCUMENTS

| | | | |
|---|---|---|---|
| 5,238,532 | 8/1993 | Zarowin et al. | 156/643 |
| 5,254,830 | 10/1993 | Zarowin et al. | 219/121.43 |
| 5,290,382 | 3/1994 | Zarowin et al. | 156/345 |
| 5,291,415 | 3/1994 | Zarowin et al. | 364/474.3 |
| 5,336,355 | 8/1994 | Zarowin et al. | 156/345 |
| 5,376,224 | 12/1994 | Zarowin | 156/643 |
| 5,419,803 | 5/1995 | Mumola | 216/38 |
| 5,688,415 | 11/1997 | Bollinger et al. | 219/121.41 |
| 5,923,425 | 7/1999 | Dewa et al. | 356/353 |

*Primary Examiner*—Benjamin L. Utech
*Assistant Examiner*—Kin-Chan Chen
*Attorney, Agent, or Firm*—Senniger, Powers, Leavitt & Roedel

[57] ABSTRACT

A process for improving the uniformity of the thickness of a semiconductor substrate utilizing plasma assisted chemical etching is disclosed. The process includes measuring the thickness of a semiconductor substrate at discrete points on the front surface, computing a dwell time versus position map based on the measured thickness data, mathematically inverting the position map to allow material to be removed from the back surface, and selectively removing material from the back surface of the substrate by plasma assisted chemical etching to improve the thickness uniformity of the substrate.

11 Claims, 1 Drawing Sheet

PROCESS FOR IMPROVING UNIFORM THICKNESS OF SEMICONDUCTOR SUBSTRATES USING PLASMA ASSISTED CHEMICAL ETCHING

BACKGROUND OF THE INVENTION

The present invention relates to a process for improving the global flatness of semiconductor substrates using plasma assisted chemical etching. In particular, the present invention relates to a process for improving global flatness of semiconductor substrates by removing material from the back surface of a semiconductor substrate by plasma assisted chemical etching.

Conventional processes for thinning and figuring surfaces and films employ such methods as mechanical polishing, grinding, sputtering, sand blasting, and chemomechanical processes. Each of these processes usually have substantial processing limitations. Mechanical and chemomechanical processes for thinning semiconductor films are contact methods that leave contaminants on the surface and cause subsurface damage to the substrate. Also, conventional thinning processes do not allow corrections of the spatial variation of the film thickness across the substrate.

Plasma assisted chemical etching (PACE) methods to shape the surfaces of substrates are an improvement over the conventional processes such as chemomechanical thinning because such plasma processes do not contact the substrate surface, and therefore reduce the potential for subsurface damage. In the PACE process, a plasma generates a chemically reactive species from a gas such as sulfur hexafluoride and the surface of the substrate facing the plasma etching electrode is etched or thinned at defined locations to improve the overall global thickness uniformity of the substrate. This type of etching has many applications in the semiconductor industry, including selective thickness reduction of the surface of semiconductor substrates to improve the global flatness of the substrate. A high degree of global substrate flatness is crucial for subsequent device fabrication steps.

It is well known in the art that a conventional plasma etching system for improving global flatness of a substrate typically has three major components. These components include a device to measure the thickness of the substrate at discrete points on the substrate, computational hardware and software to compute a thickness map of the substrate and required plasma electrode dwell time based on the individual thickness measurements, and material removal hardware to execute the plasma tool motion and make the substrate modifications based on the thickness map and dwell time generated.

During the conventional PACE process, the substrate being modified to improve global flatness is secured to a platform within a vacuum chamber which is in combination with a plasma reactor and electrode. The front side of the substrate utilized in subsequent device fabrication is facing upward toward the plasma electrode, and the back side of the substrate is in contact with and facing the platform. A feed gas is introduced into the plasma electrode, and the plasma generates chemically reactive species from the feed gas. The chemically reactive species interact with the substrate surface to form volatile by-products, which etch the surface of the substrate and reduce its thickness at each individual position etched. The plasma electrode is scanned over the surface of the substrate in relation to the thickness map for the substrate generated prior to the PACE step.

Although conventional PACE technology has many recognized advantages over other substrate thinning or flattening methods such as mechanical polishing or grinding, it is not without limitations. PACE processes currently utilized require that the substrate surface to be plasma etched be ultra-clean to prevent contaminant particles from causing masking problems during the PACE procedure and the subsequent formation of Light Channel Defects on the polished surface. Furthermore, the PACE process can itself introduce contaminants or artifacts onto the substrate surface such as byproducts from the etching reaction or scan lines from the scanning of the plasma. These etching artifacts may be difficult to remove from the substrate surface in subsequent processing steps.

SUMMARY OF THE INVENTION

Among the objects of the present invention, therefore, are the provision of a process for improving the global flatness and quality of semiconductor substrates; the provision of a process which eliminates frontside masking problems on the flattened substrate; the provision of a process which increases overall throughput of flattened substrates; the provision of a process for flattening semiconductor substrates which eliminates any scanning pattern on the front surface; the provision of a process for flattening semiconductor substrates using PACE technology where material is removed from the back surface of the substrate; and the provision of a process where contamination byproducts from the PACE process on the front surface of the substrate are reduced.

Briefly, therefore, the present invention is directed to a process for flattening a semiconductor substrate using plasma assisted chemical etching. Thickness measurements of the substrate are made at discrete positions on the front surface using the back surface as the reference surface. The measured thickness data are collected and a dwell time versus position map of the substrate is generated. This map is subsequently inverted mathematically, and material is selectively removed from the back surface of the substrate based on the inverted dwell time versus position map by plasma assisted chemical etching to improve the global flatness of the substrate.

The invention is further directed to a process for flattening a semiconductor substrate using plasma assisted chemical etching where the etching step is completed after a rough polishing step but before a final touch polishing step. A substrate is subjected to a rough polishing step where between about 20 and about 30 micrometers of material are removed from the front surface of the substrate. After this rough polishing, thickness measurements of the substrate are made at discrete positions on the front surface using the back surface as the reference surface. These data are collected, and a dwell time versus position map of the substrate is generated, and inverted mathematically. Material is then removed selectively from the back surface of the substrate based on the inverted substrate thickness map by plasma assisted chemical etching. Subsequently, the substrate is subjected to a final polishing step where between about 100 and about 5000 angstroms of material are removed from the front surface.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

Figure 1:
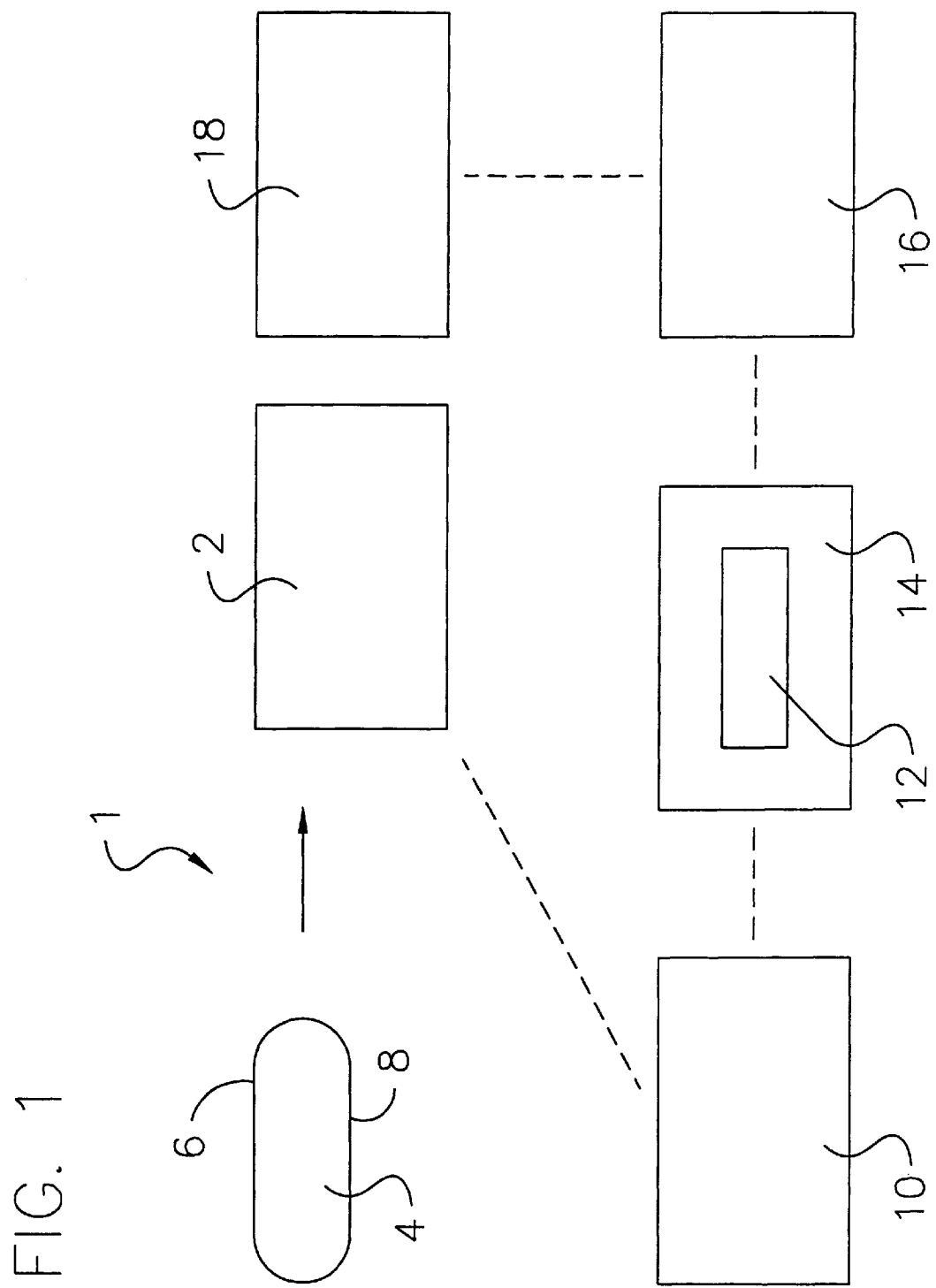
FIG. 1 is a diagram of a system for improving the global flatness of a semiconductor substrate embodying the principles of the present invention.

In accordance with the present invention, it has been discovered that both the resulting global flatness as well as the quality of a semiconductor substrate can be improved by selectively removing material from the back surface of a substrate by plasma assisted chemical etching using a mathematically inverted dwell time versus position map. Surprisingly, it has been discovered that because silicon substrates are extremely flexible and freely conform under vacuum to the flat surface of device fabrication chucks, removing material from the unpolished back surface of the substrate is an effective means for improving non-uniformity and global flatness of the substrate without introducing contamination or defects onto the front surface subsequently utilized for device fabrication.

Referring now to FIG. 1, there is shown a system 1 for removing material from the surface of a semiconductor substrate 4, such as a silicon wafer. The system includes a means 2 for measuring thickness profile data for substrate 4 having a front surface 6 and a back surface 8, a means 10 for converting the thickness profile data to a dwell time versus position map 12 stored in computational hardware 14, means 16 for inverting mathematically the dwell time versus position map 12, and means 18 for removing material from substrate 4 in accordance with position map 12 such that the substrate achieves a preselected uniform thickness profile.

The substrate 4 is first introduced into means 2 in order to generate thickness profile data for the substrate based on measurements at discrete positions on the substrate. Numerous conventional measurement techniques that are available for determining thickness profile data of semiconductor substrates are widely known in the art and are satisfactory for use in the present invention. In one method, capacitance measurements across the thickness of the substrate at discrete points are utilized to determine the thickness profile data. Alternatively, the thickness profile data can be gathered through the use of conventional optical means such as a differential interferometer, an ultrasonic thickness gauge, a full surface interferometer, or a pair of laser gauges.

The thickness profile data collected represent a point-by-point thickness of the substrate. These data are orientated to the front surface of the substrate, and are subsequently processed by the converting means 10 to produce a dwell time versus position thickness map for the upper surface of the substrate based on a preselected target global flatness. A typical dwell time vs. position map is described in U.S. Pat. No. 5,254,830. The dwell time vs. position map represents the length of time that the plasma removal electrode must remain at each specified position over the front surface of the substrate to produce the target flatness. This map 12 is stored in hardware 14.

With earlier conventional PACE techniques, the front surface of the substrate would then be subjected to a PACE treatment to improve global flatness according the dwell time versus position map generated based on the thickness data for the front surface of the substrate. Typical of references describing the conventional PACE process are U.S. Pat. Nos. 5,238,532, 5,290,382, 5,291,415, and 5,254,830. Conventional PACE procedures selectively remove material from the front surface of the substrate according to the dwell time vs. position map generated to improve the global flatness of the resulting substrate. However, as previously discussed, there are certain limitations required for applying PACE to the front surface of a substrate. First, the substrate must have a very low level of contaminants on the front surface to minimize resulting masking problems which result if the contaminant itself is etched instead of the substrate surface. When this occurs, the material, such as silicon, underlying the contaminant is under-etched and remains as a bump of material on the surface. Such bumps can be subsequently revealed as defects. Also, larger contaminants present on the front surface of the substrate can lead to a large anomalies which are detected as defects by inspection tools such as the "magic mirror." In the present invention, however, these problems, as well as other problems subsequently discussed, are eliminated as material is removed utilizing a PACE process from the back surface of the substrate.

In the present invention, the dwell time versus position map generated based on point by point measurements of the front surface of the substrate is mathematically inverted by means 16 to produce a dwell time versus position map that represents measurements as if taken from the back surface of the substrate, i.e. as if the substrate had been examined with the back surface facing upward toward the measuring device. This position map produced from the mathematically inverted data allows material to be selectively removed using a PACE technique from the back surface of the substrate to improve the global flatness of the substrate without exposing the front surface to possible contamination during thickness profile data generation. Computer programs capable of performing the required mathematical inversion of the data are commercially available, for example, from The MathWorks, Inc. (Natick, Mass.) under the tradename MATLAB or from MathSoft, Inc. (Cambridge, Mass.) under the tradename MATHCAD.

After the mathematical inversion of the thickness profile data is complete, the substrate is inserted into a conventional plasma assisted chemical etching chamber such as the one described in U.S. Pat. No. 5,336,355. The substrate is inserted into the PACE apparatus, however, such that the back surface faces the plasma electrode and stream of reactive etching species and the front surface rests on the substrate support table, which has been thoroughly cleaned to minimize the risk of contamination of the substrate surface. In this manner, material is subsequently removed from the back surface of the substrate in accordance with the mathematically inverted dwell time versus position map utilizing conventional PACE techniques to produce a substrate with an improved global flatness, a reduced amount of front surface contamination, and a reduced number of etch induced artifacts.

By removing material from the back surface of the substrate as opposed to the front surface as conventionally practiced with the PACE process, the front surface is not subjected to a processing step which could increase contamination or cause damage on that surface. This approach of removing material from the back surface eliminates the possibility of scan lines being deposited on the front surface of the substrate from the scanning of the plasma during the PACE material removal step. Also, any particulate matter generated by the PACE step itself that is not removed by the vacuum system is unable to be deposited onto the front surface, further reducing the possibility of contamination.

Preferably, the PACE step of the present invention removes an average of between about 1 and about 5 micrometers of material from the back surface of the semiconductor substrate to improve the global flatness of the substrate. Typical removal rates for conventional PACE processes are generally between about 1 and about 2 micrometers per minute for 200 millimeter semiconductor substrates, and between about 0.5 and about 1 micrometer per minute for 300 millimeter substrates. It should be recognized by those skilled in the art, however, that removal rates can vary depending upon the specific conditions of the PACE apparatus.

In a preferred embodiment of the present invention, the PACE material removal step from the back surface of the substrate utilizing the mathematically inverted dwell time versus position map is completed after the semiconductor substrate has been subjected to a rough polishing step, but prior to the substrate undergoing a final or touch polishing step. In a conventional rough polishing step, between about 20 and about 30 micrometers, preferably between about 15 and about 25 micrometers of material are removed from the front surface of the substrate by techniques known in the art. After this rough polishing step, the semiconductor substrate has a global flatness of between about 0.5 to about 3 micrometers.

Subsequent to the rough polishing step, the substrate is subjected to the PACE material removal step described above to remove material from the back surface in accordance with the present invention. After the PACE step of the present invention is completed, the non-uniformity of the semiconductor substrate is reduced by up to about 90% and the resulting global flatness of the semiconductor substrate is between about 0.1 and about 0.3 micrometers. Thus, the PACE step of the present invention can reduce the non-uniformity of the semiconductor substrate to about 10% of its value prior to the PACE step.

Finally, after the PACE technique removes material from the back surface, the front surface of the substrate is subjected to a final, or touch polishing step to clean any contamination from the front surface of the substrate. This final polish removes only between about 100 and about 5000 angstroms, preferably about 500 angstroms of material from the front surface of the substrate. This step removes any contamination on the front surface of the substrate that was introduced onto that surface while it was positioned front surface down on the PACE chuck during the material removal from the back surface, or during any other step of the substrate manufacturing process. The touch polish improves the overall smoothness of the substrate, but only has a negligible effect on global flatness. After the touch polishing step, the semiconductor substrate preferably has global flatness of between about 0.1 and about 0.3 micrometers.

In view of the above, it will be seen that the several objects of the invention are achieved.

As various changes could be made in the above-described semiconductor substrate flattening process without departing from the scope of the invention, it is intended that all matter contained in the above description be interpreted as illustrative and not in a limiting sense.

What is claimed is:

1. A process for improving the uniformity of the thickness of a semiconductor substrate having a front surface and a back surface using plasma assisted chemical etching, the process comprising:
    measuring the thickness of the substrate at discrete positions on the front surface of the substrate using the back surface as a reference surface;
    processing the thickness measurements and computing a dwell time versus position map for the front surface of the substrate to determine the length of time a plasma electrode must etch the surface;
    inverting mathematically the dwell time versus position map and;
    removing material selectively from the back surface of the substrate based on the inverted dwell time versus position map by plasma assisted chemical etching to improve the uniformity of the thickness of the substrate.

2. The process as set forth in claim 1 wherein between about 1 and about 5 micrometers of material is removed from the back surface.

3. The process as set forth in claim 1 wherein the substrate is a silicon wafer.

4. A process for improving the uniformity of the thickness of a semiconductor substrate having a front surface and a back surface using plasma assisted chemical etching, the process comprising:
    polishing the front surface of the substrate to remove between about 20 and about 30 micrometers of material from the front surface;
    measuring the thickness of the polished substrate at discrete positions on the front surface of the substrate using the back surface as a reference surface;
    processing the thickness measurements and computing a dwell time versus position map for the front surface of the polished substrate to determine the length of time a plasma electrode must etch the surface;
    inverting mathematically the dwell time versus position map;
    removing material selectively from the back surface of the polished substrate based on the inverted dwell time versus position map by plasma assisted chemical etching to improve the uniformity of the thickness of the substrate; and
    re-polishing the front surface of the polished substrate to remove between about 100 and about 5000 angstroms of material from the front surface.

5. The process as set forth in claim 4 wherein between about 1 and about 5 micrometers of material is removed from the back surface.

6. The process as set forth in claim 4 wherein the substrate has a total thickness variation of no more than about 0.3 micrometers after the second polishing step.

7. The process as set forth in claim 4 wherein the substrate has a total thickness variation of about 0.1 micrometers after the second polishing step.

8. The process as set forth in claim 4 wherein about 500 angstroms of material is removed from the front surface of the substrate in the second polishing step.

9. The process as set forth in claim 4 wherein the substrate is a silicon wafer.

10. A process for reducing the non-uniformity of a semiconductor substrate having a front surface and a back surface by about 90% using plasma assisted chemical etching, the process comprising:
    polishing the front surface of the substrate to remove between about 20 and about 30 micrometers of material from the front surface;
    measuring the thickness of the polished substrate at discrete positions on the front surface of the substrate using the back surface as a reference surface;
    processing the thickness measurements and computing a dwell time versus position map for the front surface of the polished substrate to determine the length of time a plasma electrode must etch the surface;
    inverting mathematically the dwell time versus position map;
    removing material selectively from the back surface of the polished substrate based on the inverted dwell time versus position map by plasma assisted chemical etching to improve the uniformity of the thickness of the substrate; and
    re-polishing the front surface of the polished substrate to remove between about 100 and about 5000 angstroms of material from the front surface.

11. The process as set forth in claim 10 wherein the substrate is a silicon wafer.

* * * * *